(12) United States Patent  (10) Patent No.: US 8,921,708 B2
Sakurai et al.  (45) Date of Patent: Dec. 30, 2014

(54) ELECTRONIC-COMPONENT MOUNTED BODY, ELECTRONIC COMPONENT, AND CIRCUIT BOARD

(75) Inventors: Daisuke Sakurai, Osaka (JP); Kazuya Usirokawa, Osaka (JP)

(73) Assignee: Panasonic Corporation, Osaka (JP)

( * ) Notice: Subject to any disclaimer, the term of this patent is extended or adjusted under 35 U.S.C. 154(b) by 156 days.

(21) Appl. No.: 13/821,521

(22) PCT Filed: Sep. 22, 2011

(86) PCT No.: PCT/JP2011/005329
§ 371 (c)(1),
(2), (4) Date: Mar. 7, 2013

(87) PCT Pub. No.: WO2012/073417
PCT Pub. Date: Jul. 6, 2012

(65) Prior Publication Data
US 2013/0170165 A1 Jul. 4, 2013

(30) Foreign Application Priority Data
Dec. 1, 2010 (JP) .................................. 2010-267943

(51) Int. Cl.
| H05K 1/11 | (2006.01) |
| H05K 7/06 | (2006.01) |
| H01L 21/56 | (2006.01) |
| H01L 23/498 | (2006.01) |
| H01L 23/00 | (2006.01) |
| H01L 23/36 | (2006.01) |
| H01L 21/48 | (2006.01) |
| H01L 23/544 | (2006.01) |
| H05K 1/02 | (2006.01) |
| H01L 23/367 | (2006.01) |

(52) U.S. Cl.
CPC ............... *H05K 7/06* (2013.01); *H01L 21/563* (2013.01); *H01L 23/49838* (2013.01);
(Continued)

(58) Field of Classification Search
USPC .................................. 174/261; 361/767–776
See application file for complete search history.

(56) References Cited

U.S. PATENT DOCUMENTS
5,828,128 A 10/1998 Higashiguchi et al.
6,229,220 B1 5/2001 Saitoh et al.

FOREIGN PATENT DOCUMENTS
JP 6-112463 4/1994
JP 9-45810 2/1997
(Continued)

*Primary Examiner* — Jeremy C Norris
(74) *Attorney, Agent, or Firm* — Hamre, Schumann, Mueller & Larson, P.C.

(57) ABSTRACT

An electronic-component mounted body of the present invention includes an electronic component mounted on a circuit board. The electronic component includes multiple component-side electrode terminals, and the circuit board includes multiple circuit-board side electrode terminals for the component-side electrode terminals. The electronic-component mounted body further includes: multiple protruded electrodes formed respectively on the component-side electrode terminals of the electronic component to electrically connect the electronic component and the circuit board; and a dummy electrode formed on the electronic component and electrically connected to the component-side electrode terminal in a predetermined position out of the component-side electrode terminals. The protruded electrode on the component-side electrode terminal in the predetermined position is higher than the protruded electrode on the component-side electrode terminal in a different position from the predetermined position.

26 Claims, 9 Drawing Sheets

(52) U.S. Cl.
CPC .............. *H01L 24/05* (2013.01); *H01L 24/14*
(2013.01); *H01L 23/36* (2013.01); ***H01L
21/4853* (2013.01); *H01L 23/544*** (2013.01);
*H01L 24/11* (2013.01); *H01L 24/13* (2013.01);
*H05K 1/02* (2013.01); *H01L 23/3677*
(2013.01); *H01L 24/17* (2013.01); *H01L 24/02*
(2013.01); *H01L 24/73* (2013.01); *H01L 24/81*
(2013.01); *H01L 2224/023* (2013.01); *H01L
2224/02372* (2013.01); *H01L 2224/02377*
(2013.01); *H01L 2224/02379* (2013.01); *H01L
2224/0401* (2013.01); *H01L 2224/05569*
(2013.01); *H01L 2224/1403* (2013.01); *H01L
2224/14131* (2013.01); *H01L 2224/14136*
(2013.01); *H01L 2224/14179* (2013.01); *H01L
2224/14515* (2013.01); *H01L 2224/73104*
(2013.01); *H01L 2224/73204* (2013.01); *H01L
2224/81007* (2013.01); *H01L 2224/81191*
(2013.01); *H01L 2224/81193* (2013.01); *H01L
2224/831* (2013.01); *H01L 2924/014* (2013.01);
*H01L 2224/13084* (2013.01); *H01L 2224/8113*
(2013.01); *H01L 24/83* (2013.01); *H01L 24/92*
(2013.01); *H01L 2223/5442* (2013.01); *H01L
2223/54426* (2013.01); *H01L 2224/05624*
(2013.01); *H01L 2224/11442* (2013.01); *H01L
2224/11464* (2013.01); *H01L 2224/13082*
(2013.01); *H01L 2224/13083* (2013.01); *H01L
2224/13109* (2013.01); *H01L 2224/13111*
(2013.01); *H01L 2224/13144* (2013.01); *H01L
2224/13155* (2013.01); *H01L 2224/136*
(2013.01); *H01L 2224/81132* (2013.01); *H01L
2224/81203* (2013.01); *H01L 2224/81411*
(2013.01); *H01L 2224/81444* (2013.01); *H01L
2224/81815* (2013.01); *H01L 2224/83862*
(2013.01); *H01L 2224/92125* (2013.01); *H01L
2224/1182* (2013.01); *H01L 2924/01029*
(2013.01); *H01L 2924/3512* (2013.01); *H01L
2924/35121* (2013.01); *H01L 2924/381*
(2013.01); *H01L 2924/3841* (2013.01); *H01L
24/16* (2013.01); *H01L 2224/16227* (2013.01);
*H01L 2224/17051* (2013.01); *H01L 2224/16225*
(2013.01)
USPC ........................ 174/261; 361/767; 361/774

(56) References Cited

FOREIGN PATENT DOCUMENTS

| | | |
|---|---|---|
| JP | 9-97791 | 4/1997 |
| JP | 9-232506 | 9/1997 |
| JP | 10-303249 | 11/1998 |
| JP | 2003-282617 | 10/2003 |
| JP | 2005-203413 | 7/2005 |

(a0)

(a2)

(a1)

(b)

(c)

(d)

(a)

(b)

(a)

(b)

(c)

(d)

(a)

(b)

(c)

(d)

ELECTRONIC-COMPONENT MOUNTED BODY, ELECTRONIC COMPONENT, AND CIRCUIT BOARD

TECHNICAL FIELD

The present invention relates to an electronic-component mounted body including an electronic component mounted on a circuit board, and the electronic component and circuit board used for the electronic-component mounted body.

BACKGROUND ART

In flip-chip mounting, generally, protruded electrodes such as solder bumps are formed on electrodes of semiconductor elements such as LSIs, and the semiconductor elements with the protruded electrodes formed thereon are mounted face-down on mounting boards. Specifically, the protruded electrodes on the semiconductor elements are pressed against electrode terminals on the mounting boards while being heated. A typical method for forming solder bumps on electrodes of semiconductor elements includes forming solder layers on the electrodes by screen printing, dispensing, or electrolytic plating, and then heating the solder layers to at least the melting point of solder in a reflow furnace.

In recent years, electrode terminals of semiconductor elements have been arranged with narrower pitch and smaller area in order to facilitate increase in the density and number of electrode terminals of semiconductor elements. The reduction in the pitch of electrode terminals of semiconductor elements may cause short-circuits between the electrode terminals in the case where the electrode terminals are arranged in a line or two lines in a zigzag pattern along the outer peripheries of the semiconductor elements as in the related art. Further, the reduction in the pitch of electrode terminals of semiconductor elements may warp mounting boards due to differences in thermal expansion coefficient between the semiconductor elements and the mounting boards, thereby causing connection failure. Thus, an area array has been adopted in which the electrode terminals of semiconductor elements are arranged in a matrix pattern, thereby increasing the pitch between the electrode terminals.

In recent years, however, electrode terminals have been further arranged with narrower pitch even in an area array, so that solder joints have been arranged with narrower pitch. Moreover, gaps have been narrowed between semiconductor elements and circuit board terminals. For these reasons, in the pressing and heating step of flip-chip mounting, solder bridge defects may be caused. Solder bridge defects may be caused with molten and transformed solder bumps connected to each other by the surface tension of solder.

Thus, there has been proposed a semiconductor device in which protruded electrodes made of gold or copper are covered by an insulating film containing metal particles (for example, see Patent Literature 1). In the semiconductor device, the insulating film and the protruded electrodes are not molten during flip-chip mounting. A force is generated in a compressing direction when sealing resin between a semiconductor element and a circuit board is cured and contracted. The force causes the metal particles contained in the insulating film to contact the protruded electrodes and the circuit board terminals, thereby electrically connecting the protruded electrodes of the semiconductor element and the circuit board terminals. Thus, the semiconductor device can prevent the occurrence of bridge even when electrode terminals are arranged with narrower pitch.

However, in the connection configuration in which electrical conduction is obtained only by the contact of the metal particles with the protruded electrodes and the circuit board terminals without diffusion bonding, as a matter of course, as the electrode area of the semiconductor element decreases, the number of conductive particles between the protruded electrodes and the circuit board terminals decreases. Thus, resistive connection increases, thereby increasing the transmission loss of signals. Particularly in recent years, since electrode terminals of semiconductor elements have been stringently required to be arranged with narrower pitch, the electrode terminals of the semiconductor elements have been further reduced in area, thereby adding to the foregoing problem.

Thus, there has been adopted a protruded electrode having a two-layer structure which includes a lower-layer metal and an upper-layer metal. The lower-layer metal is a high-melting-point metal, and the upper-layer metal is formed on the lower-layer metal by solder (for example, see Patent Literature 2). In the protruded electrode having a two-layer structure, the amount of solder can be made smaller than that in a protruded electrode formed of only a solder layer, thereby reducing the amount of solder protruded in a planar direction during flip-chip mounting. This can prevent the occurrence of solder bridge. Further, the protruded electrode having a two-layer structure causes solder and a circuit board terminal to be diffusion-bonded, thereby reducing resistive connection. Thus, the transmission loss of signals does not increase.

CITATION LIST

Patent Literatures

Patent Literature 1: Japanese Patent Laid-Open No. 2003-282617
Patent Literature 2: Japanese Patent Laid-Open No. 9-97791

SUMMARY OF INVENTION

Technical Problem

In recent years, however, in order to respond to demands for finer design rules and faster signal processing, low-permittivity insulating films such as low-k films and ultra low-k (ULK) films have been used for interlayer insulating films of semiconductor elements. The low-permittivity insulating films are porous films with multiple holes of several nm for reducing the permittivity. The densities of the low-permittivity insulating films are, for example, 1.0 g/cm$^3$ to 1.4 g/cm$^3$. Thus, the low-permittivity insulating films are brittle. For this reason, in the mounting method of the related art, the low-permittivity insulating films may be easily peeled off or cracked.

The problem will be specifically described using the mounting method of Patent Literature 2 as an example. FIG. 9 is a schematic diagram illustrating the mounting method of Patent Literature 2. As shown in the upper drawing of FIG. 9, a bump 103 composed of an electrode 102a and a solder joint 102b is formed on a semiconductor element 101. In this mounting method, as shown in FIG. 9, after the bump 103 is aligned with an electrode 105 on a circuit board 104, the semiconductor element 101 is heated and pressed against the circuit board 104 to melt the solder joint 102b. Thus, the semiconductor element 101 is mounted on the circuit board 104.

However, in the case where the bumps 103 composed of the electrodes 102 and the solder joints 102 are uniform in height in a plane as in the mounting method of Patent Literature 2, a brittle low-permittivity insulating film immediately under the electrode 102a disposed in the corner portion of the semiconductor element 101 may be peeled off or cracked. This is because a large stress acts on the low-permittivity insulating film immediately under the electrode 102a in the corner portion of the semiconductor element 101 in a flip-chip process, in the case where the bumps 103 are uniform in height. That is, in the cooling step after solder is molten in the flip-chip process, a thermal stress caused by differences in modulus of elasticity and linear expansivity between the semiconductor element 101 and the circuit board 104 concentrates on the solder joint 102b in the corner portion of the semiconductor element 101. The stress is transferred directly to a layer immediately under the electrode 102a on the semiconductor element 101 without being reduced. Further, even in an environment in which a large temperature difference occurs, a thermal stress concentrates as in the flip-chip process, thereby peeling off or cracking the brittle low-permittivity insulating film immediately under the electrode.

In view of the foregoing problems, an object of the present invention is to provide an electronic-component mounted body, electronic component, and circuit board which can easily obtain high connection reliability, even in the case where an electronic component such as a semiconductor element having a brittle film is mounted on a circuit board.

Solution to Problem

In order to attain the object, a first electronic-component mounted body of the present invention includes: an electronic component having a plurality of component-side electrode terminals; a circuit board having a plurality of circuit-board side electrode terminals for the component-side electrode terminals, the electronic component being mounted on the circuit board; a plurality of protruded electrodes formed respectively on the component-side electrode terminals on the electronic component to electrically connect the electronic component and the circuit board; and at least one dummy electrode formed on the electronic component and electrically connected to the component-side electrode terminal in a predetermined position out of the component-side electrode terminals, wherein the protruded electrode on the component-side electrode terminal in the predetermined position electrically connected to the at least one dummy electrode is higher than the protruded electrodes on the component-side electrode terminals in different positions from the predetermined position.

In the first electronic-component mounted body of the present invention, the at least one dummy electrode may be electrically connected to the component-side electrode terminal disposed in a position corresponding to the corner portion of the electronic component, out of the component-side electrode terminals.

In the first electronic-component mounted body of the present invention, the at least one dummy electrode may include a plurality of different types of dummy electrodes having different areas, and the protruded electrode on the component-side electrode terminal electrically connected to the dummy electrode having a larger area than the other dummy electrodes may be higher than the other protruded electrodes. Further, in this configuration, the dummy electrodes may include: the first dummy electrode electrically connected to the first component-side electrode terminal disposed in a position corresponding to the corner portion of the electronic component; and the second dummy electrode electrically connected to the second component-side electrode terminal adjacent to the first component-side electrode terminal, the second dummy electrode having a smaller area than the first dummy electrode, and the protruded electrode on the first component-side electrode terminal may be higher than the protruded electrode on the second component-side electrode terminal.

In the first electronic-component mounted body of the present invention, the at least one dummy electrode may be formed on a surface different from the surface of the electronic component on which the component-side electrode terminals are disposed. In this configuration, the at least one dummy electrode may be electrically connected to the component-side electrode terminal disposed in a position corresponding to the corner portion of the electronic component, out of the component-side electrode terminals. Further, in this configuration, the component-side electrode terminals may be arranged in a matrix pattern, and the at least one dummy electrode may be electrically connected to the component-side electrode terminal in the center of an area where the component-side electrode terminals are disposed. Moreover, in this configuration, the at least one dummy electrode may be connected to a power supply terminal or a heat sink.

In the first electronic-component mounted body of the present invention, the at least one dummy electrode may be formed on a surface on which the component-side electrode terminals are disposed and may be shaped so as to function as a recognition mark for position adjustment.

In order to attain the object, a second electronic-component mounted body includes: an electronic component having a plurality of component-side electrode terminals; a circuit board having a plurality of circuit-board side electrode terminals for the component-side electrode terminals, the electronic component being mounted on the circuit board; a plurality of protruded electrodes formed respectively on the circuit-board side electrode terminals on the circuit board to electrically connect the electronic component and the circuit board; at least one dummy electrode formed on the circuit board and electrically connected to the circuit-board side electrode terminal in a predetermined position out of the circuit-board side electrode terminals, wherein the protruded electrode on the circuit-board side electrode terminal in the predetermined position electrically connected to the at least one dummy electrode is higher than the protruded electrodes on the circuit-board side electrode terminals in different positions from the predetermined position.

In the second electronic-component mounted body of the present invention, the at least one dummy electrode may be electrically connected to the circuit-board side electrode terminal disposed in a position corresponding to the corner portion of the electronic component, out of the circuit-board side electrode terminals.

In the second electronic-component mounted body of the present invention, the at least one dummy electrode may include a plurality of different types of dummy electrodes having different areas, and the protruded electrode on the circuit-board side electrode terminal electrically connected to the dummy electrode having a larger area than the other dummy electrodes may be higher than the other protruded electrodes. Further, in this configuration, the dummy electrodes may include: the first dummy electrode electrically connected to the first circuit-board side electrode terminal disposed in a position corresponding to the corner portion of the electronic component; and the second dummy electrode electrically connected to the second circuit-board side electrode terminal adjacent to the first circuit-board side electrode terminal, the second dummy electrode having a smaller area than the first dummy electrode, and the protruded electrode on the first circuit-board side electrode terminal may be higher than the protruded electrode on the second circuit-board side electrode terminal.

In order to attain the object, an electronic component includes: a plurality of component-side electrode terminals; at least one dummy electrode electrically connected to the component-side electrode terminal in a predetermined position out of the component-side electrode terminals; and a plurality of protruded electrodes formed respectively on the component-side electrode terminals, wherein the protruded electrode on the component-side electrode terminal in the predetermined position electrically connected to the at least one dummy electrode is higher than the protruded electrodes on the component-side electrode terminals in different positions from the predetermined position.

In the electronic component of the present invention, the at least one dummy electrode may be electrically connected to the component-side electrode terminal disposed in a position corresponding to the corner portion of the electronic component, out of the component-side electrode terminals.

In the electronic component of the present invention, the at least one dummy electrode may include a plurality of different types of dummy electrodes having different areas, and the protruded electrode on the component-side electrode terminal electrically connected to the dummy electrode having a larger area than the other dummy electrodes may be higher than the other protruded electrodes. Further, in this configuration, the dummy electrodes may include: the first dummy electrode electrically connected to the first component-side electrode terminal disposed in a position corresponding to the corner portion of the electronic component; and the second dummy electrode electrically connected to the second component-side electrode terminal adjacent to the first component-side electrode terminal, the second dummy electrode having a smaller area than the first dummy electrode, and the protruded electrode on the first component-side electrode terminal may be higher than the protruded electrode on the second component-side electrode terminal.

In the electronic component of the present invention, the at least one dummy electrode may be formed on a surface different from a surface on which the component-side electrode terminals are disposed. In this configuration, the at least one dummy electrode may be electrically connected to the component-side electrode terminal disposed in a position corresponding to the corner portion of the electronic component, out of the component-side electrode terminals. Further, in this configuration, the component-side electrode terminals may be arranged in a matrix pattern, and the at least one dummy electrode may be electrically connected to the component-side electrode terminal in the center of an area where the component-side electrode terminals are disposed.

In the electric component of the present invention, the at least one dummy electrode may be formed on a surface on which the component-side electrode terminals are disposed and may be shaped so as to function as a recognition mark for position adjustment.

In order to attain the object, a circuit board includes: a plurality of circuit-board side electrode terminals; at least one dummy electrode electrically connected to the circuit-board side electrode terminal in a predetermined position out of the circuit-board side electrode terminals; and a plurality of protruded electrodes formed respectively on the circuit-board side electrode terminals, wherein the protruded electrode on the circuit-board side electrode terminal in the predetermined position electrically connected to the at least one dummy electrode is higher than the protruded electrodes on the circuit-board side electrode terminals in different positions from the predetermined position.

In the circuit board of the present invention, the at least one dummy electrode may be electrically connected to the circuit-board side electrode terminal disposed in a position corresponding to the corner portion of an electronic component mounted on the circuit board, out of the circuit-board side electrode terminals.

In the circuit board of the present invention, the at least one dummy electrode may include a plurality of different types of dummy electrodes having different areas, and the protruded electrode on the circuit-board side electrode terminal electrically connected to the dummy electrode having a larger area than the other dummy electrodes may be higher than the other protruded electrodes. Further, in this configuration, the dummy electrodes may include: the first dummy electrode electrically connected to the first circuit-board side electrode terminal disposed in a position corresponding to the corner portion of an electronic component mounted on the circuit board; and the second dummy electrode electrically connected to the second circuit-board side electrode terminal adjacent to the first circuit-board side electrode terminal, the second dummy electrode having a smaller area than the first dummy electrode, and the protruded electrode on the first circuit-board side electrode terminal may be higher than the protruded electrode on the second circuit-board side electrode terminal.

Advantageous Effects of Invention

According to the present invention, since it is possible to selectively increase the height of the protruded electrode on a portion which shows the largest warpage on the circuit board, the warpage of the circuit board can be absorbed during mounting. Thus, the warpage is absorbed, so that the amount of extension of the solder joint is reduced in a vertical direction (tensile direction) in the cooling process after solder is solidified and a thermal stress is reduced in the tensile direction.

Further, according to the present invention, since it is possible to set the protruded electrode provided in the corner portion of the electronic component higher than the protruded electrodes provided in different positions from the corner portion, the bond gap can be increased in the corner portion of the electronic component. This can reduce the concentration of a thermal stress on the electrode terminals of the electronic component in a shearing direction as compared to the case where the bond gaps are uniform. The reduction of a thermal stress can reduce a thermal stress on a brittle film such as a low-permittivity insulating film immediately under the electrode terminals of the electronic component. Thus, the brittle film can be prevented from being peeled off or cracked, thereby obtaining high connection reliability.

Hence, according to the present invention, high connection reliability can be easily obtained, even in the case where the electronic component such as a semiconductor element having a brittle film is mounted on the circuit board.

DESCRIPTION OF EMBODIMENTS

Referring to the accompanying drawings, the following will describe embodiments of the present invention. In each of the following embodiments, an electronic-component mounted body including an electronic component mounted on a circuit board will be described using, as an example, a semiconductor device including a semiconductor element mounted on a circuit board.

First Embodiment

Figure 1A:
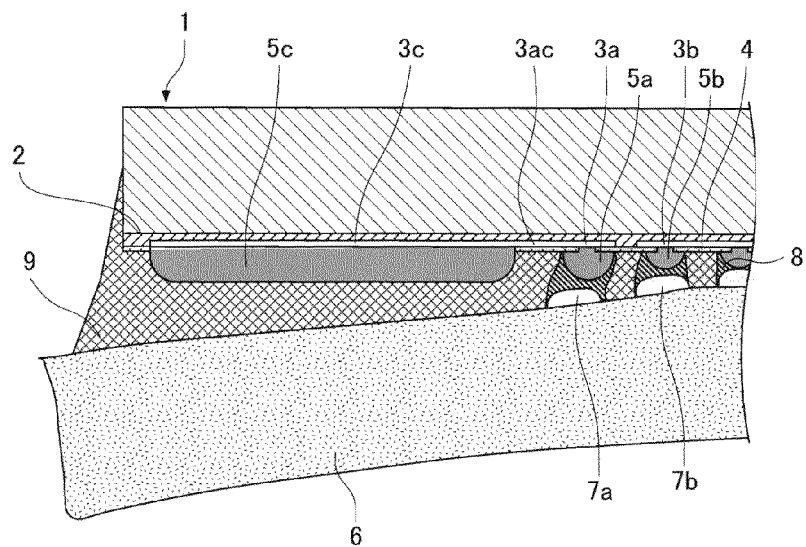
FIG. 1A is a cross-sectional view schematically showing the principal part of an electronic-component mounted body according to a first embodiment of the present invention.
Figure 1B:
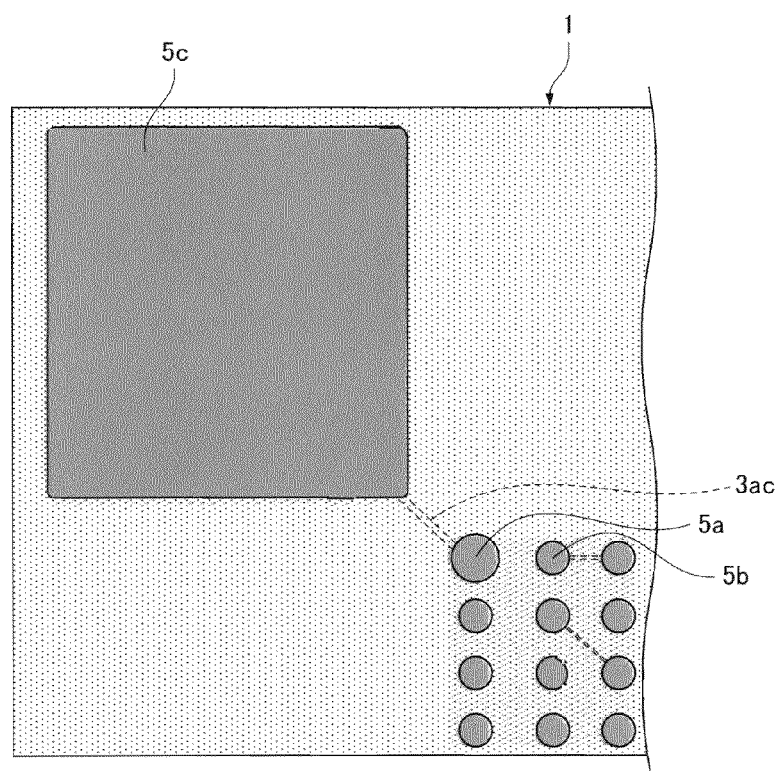
FIG. 1B is a plan view schematically showing the principal part of the electronic-component mounted body according to the first embodiment of the present invention.

FIG. 1A is a cross-sectional view schematically showing the principal part of a semiconductor device according to a first embodiment of the present invention. FIG. 1B is a plan view schematically showing the principal part of a semiconductor element according to the first embodiment of the present invention, the semiconductor element being viewed from the side of the major surface (electrode surface) on which component side electrode terminals are formed.

On the inner layer of the electrode surface of a semiconductor element 1, a multilayered wiring layer is provided which includes a micro wiring layer of, for example, copper or aluminum and a brittle low-permittivity insulating film 2 such as a low-k film or an ultra low-k film. On the outermost surface of the multilayered wiring layer, a plurality of component-side electrode terminals 3 are provided at regular intervals in a matrix pattern.

The component-side electrode terminals 3 include a first component-side electrode terminal 3a and a second component-side electrode terminal 3b. The first component-side electrode terminal 3a is disposed in a position corresponding to the corner portion of the semiconductor element 1, and the second component-side electrode terminal 3b is disposed in a different position from the first component-side electrode terminal 3a. Further, outside an area where the component-side electrode terminals 3 are disposed, a dummy electrode 3c having a larger area than the component-side electrode terminals 3 is provided and electrically connected to the first component-side electrode terminal 3a by a wire 3ac. For example, the first component-side electrode terminal 3a, the second component-side electrode terminal 3b, the dummy electrode 3c, and the wire 3ac may lie in the same plane. The first component-side electrode terminal 3a, the second component-side electrode terminal 3b, the dummy electrode 3c, and the wire 3ac are each made of, for example, Al—Cu or Al—Si—Cu.

The semiconductor element 1 further includes an insulating film 4 which covers the electrode surface. The insulating film 4 has a plurality of openings which expose at least a part of each of the first component-side electrode terminal 3a, the second component-side electrode terminal 3b, and the dummy electrode 3c, and covers wires on the electrode surface of the semiconductor element 1. The insulating film 4 is made of, for example, $Si_3N_4$.

Moreover, on the first component-side electrode terminal 3a, the second component-side electrode terminal 3b, and the dummy electrode 3c, a first protruded electrode 5a, a second protruded electrode 5b, and a dummy protruded electrode 5c are respectively provided. The first protruded electrode 5a, the second protruded electrode 5b, and the dummy protruded electrode 5c are made of a metal having solder wettability such as Ni—P/Au or Ni—Au.

Meanwhile, a circuit board 6 with the semiconductor element 1 mounted thereon has a first circuit-board side electrode terminal 7a and a second circuit-board side electrode terminal 7b on the major surface. The first circuit-board side electrode terminal 7a and the second circuit-board side electrode terminal 7b are opposed to the first protruded electrode 5a and the second protruded electrode 5b respectively. The circuit board 6 is made of, for example, silicon. The circuit-board side electrode terminals 7a and 7b are made of, for example, Ni/Au, Ni/Pd/Au, or Ni/SnAg.

The first protruded electrode 5a and the second protruded electrode 5b on the semiconductor element 1 and the first circuit-board side electrode terminal 7a and the second circuit-board side electrode terminal 7b on the circuit board 6 are joined by solder 8 and connected electrically and mechanically. The solder 8 is made of, for example, SnAg, SnAgCu, SnZn, SnZnBi, SnPb, SnBi, SnAgBiIn, SnIN, In, or Sn. Further, sealing resin 9 is injected into a gap between the semiconductor element 1 and the circuit board 6.

In the first embodiment, the semiconductor element 1 has external dimensions of 6 mm×6 mm and a thickness of 0.2 mm. On the electrode surface of the semiconductor element 1, the multiple circular component-side electrode terminals 3 are provided which have centers arranged with a pitch distance of 50 μm in a matrix pattern, a diameter of 25 μm, and a thickness of 1 μm. The circuit board 6 has external dimensions of 8 mm×8 mm and a thickness of 0.2 mm. The openings of the insulating film 4 for the component-side electrode terminals 3 are circular with a diameter of 15 μm. The opening of the insulating film 4 for the dummy electrode 3c is an 800 μm×800 μm square.

Figure 2:
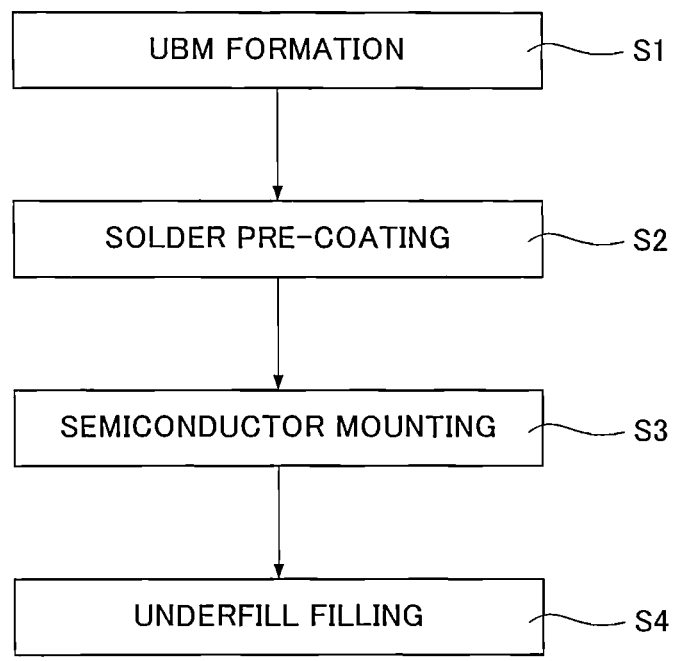
FIG. 2 is a flowchart showing a method for manufacturing the electronic-component mounted body according to the first embodiment of the present invention.

FIG. 2 is a flowchart showing a method for manufacturing the semiconductor device according to the first embodiment of the present invention. As shown in FIG. 2, in the manufacturing method of the first embodiment, first, under bump metals (UBMs) are formed as protruded electrodes on the component-side electrode terminals of the semiconductor element 1 (step S1). The circuit-board side electrode terminals on the circuit board 6 are pre-coated with a solder material to form solder layers (step S2). Next, the component-side electrode terminals on the semiconductor element 1 and the circuit-board side electrode terminals on the circuit board 6 are aligned, and the semiconductor element 1 is mounted on the circuit board 6 (step S3). Thereafter, the gap between the semiconductor element 1 and the circuit board 6 is filled with underfill (step S4).

Figure 3:
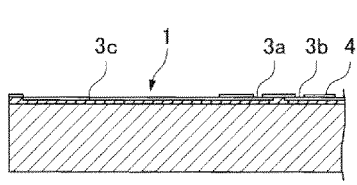
FIG. 3 is a conceptual diagram illustrating the method for manufacturing the electronic-component mounted body according to the first embodiment of the present invention from one step to another.
Figure 3:
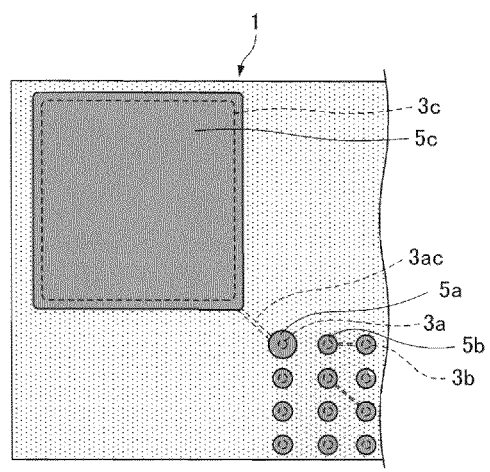
Figure 3:
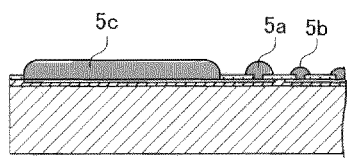
Figure 3:
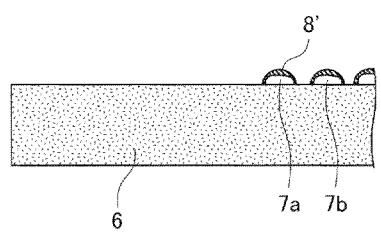
Figure 3:
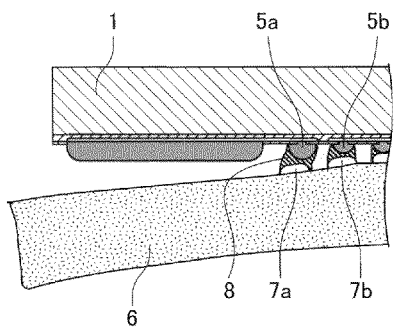
Figure 3:
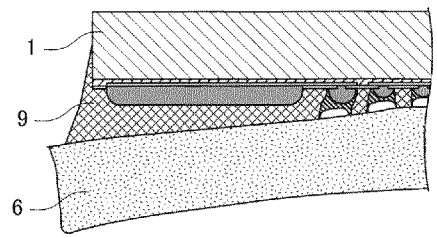

An example of the method for manufacturing the semiconductor device will be specifically described with reference to FIG. 3. FIG. 3 is a conceptual diagram illustrating the method for manufacturing the semiconductor device according to the first embodiment of the present invention from one step to another.

First, the step of forming the UBMs will be described. In this step, as shown in FIGS. 3(*a*0) and 3(*a*1), the first protruded electrode 5*a*, the second protruded electrode 5*b*, and the dummy protruded electrode 5*c* are formed on the first component-side electrode terminal 3*a*, the second component-side electrode terminal 3*b* and the dummy electrode 3*c* on the semiconductor element 1 by an electroless plating process. Specifically, after impurities are removed from the surfaces of the electrodes, the semiconductor element 1 is immersed in a zinc plating solution, and thus aluminum as the electrode material is replaced by zinc. Next, after zinc nuclei are removed, the semiconductor element 1 is immersed in the zinc plating solution again, so that smaller zinc nuclei are deposited on aluminum as the electrode material. Subsequently, the semiconductor element 1 is immersed in a Ni—P plating solution to dissolve zinc, so that a Ni—P film is deposited on aluminum as the electrode material. Thereafter, the semiconductor element 1 is immersed in an electroless gold plating solution, so that a Au film is deposited on the Ni—P film. Thus, the protruded electrodes are formed of an electroless plating metal.

In this step of forming UBMs, as shown in FIG. 3(*a*2), the total area of the dummy electrode 3*c* and the first component-side electrode terminal 3*a* electrically connected to the dummy electrode 3*c* is larger than that of the second component-side electrode terminal 3*b*. Thus, a potential difference occurs in the plating solution, so that the electron exchange in the first component-side electrode terminal 3*a* becomes more active than that in the second component-side electrode terminal 3*b*. For this reason, the deposition of the zinc nuclei in the first component-side electrode terminal 3*a* is accelerated more than that in the second component-side electrode terminal 3*b*, and the deposition of the Ni—P film and the Au film in the first component-side electrode terminal 3*a* is accelerated more than that in the second component-side electrode terminal 3*b*. In electroless plating, since plating is deposited at a constant rate in a height direction and a planar direction, the first protruded electrode 5*a* becomes larger in diameter and height than the second protruded electrode 5*b*.

In the first embodiment, the first protruded electrode 5*a* is 10 μm in height and 35 μm in diameter, while the second protruded electrode 5*b* is 8 μm in height and 31 μm in diameter. Thus, the first protruded electrode 5*a* is 2 μm higher than the second protruded electrode 5*b*. In the first embodiment, the protruded electrode 5*a* disposed in a position corresponding to the corner portion of the semiconductor element 1 is set higher than the other protruded electrode 5*b* disposed in a different position from the position corresponding to the corner portion of the semiconductor element 1. Further, the area of the dummy protruded electrode 5*c* is at least 100 times as large as that of the first protruded electrode 5*a* (projected area when the first protruded electrode 5*a* is viewed in the height direction).

The following will describe the step of coating the circuit-board side electrode terminals with a solder material. In this step, as shown in FIG. 3(*b*), solder coating layers 8' are formed on the circuit-board side electrode terminals 7*a* and 7*b* provided on the major surface of the circuit board 6. Specifically, the circuit board 6 is immersed in a tackifying compound. Next, after fine solder particles are evenly put on the circuit board 6, the circuit board 6 is cleansed. Thus, fine solder particles are applied onto the circuit-board side electrodes 7*a* and 7*b*. Thereafter, the circuit-board side electrodes 7*a* and 7*b* provided with the fine solder particles are fluxed, the circuit board 6 is put into a reflow furnace, and the solder particles are molten. Thus, the solder coating layers 8' are formed.

The solder coating layers may be formed by the following method: a solder transfer sheet is prepared which has a solder surface with fine solder powder evenly put thereon; the solder transfer sheet is placed over the semiconductor element 1 such that the solder surface is opposed to the protruded electrodes 5*a* and 5*b* on the semiconductor element 1; the solder transfer sheet is heated; and the solder transfer sheet is pressed to the semiconductor element 1. According to the above-described method, the solder particles are transferred onto the protruded electrodes 5*a* and 5*b*.

The following will describe the step of mounting the semiconductor element 1 on the circuit board 6. In this step, as shown in FIG. 3(*c*), the semiconductor element 1 is aligned with the circuit board 6 such that the first protruded electrode 5*a* and the second protruded electrode 5*b* on the semiconductor element 1 are opposed to the first circuit-board side electrode terminal 7*a* and the second circuit-board side electrode terminal 7*b* on the circuit board 6. Thereafter, the semiconductor element 1 is pressed to the circuit board 6 while being heated, so that the semiconductor element 1 is mounted on the circuit board 6. At this point, the solder coating layers 8' are heated at a temperature not lower than the melting point of solder. Thus, the solder coating layers 8' are molten to bond the first protruded electrode 5*a* to the first circuit-board side electrode terminal 7*a*, and the second protruded electrode 5*b* to the second circuit-board side electrode terminal 7*b*. After that, as shown in FIG. 3(*d*), a dispenser device is used to fill the gap between the semiconductor element 1 and the circuit board 6 with the sealing resin 9.

According to the above-described semiconductor device, since the first protruded electrode 5*a* is higher than the second protruded electrode 5*b*, a bond gap A at a bond portion containing the first protruded electrode 5*a* is larger than a bond gap B at a bond portion containing the second protruded electrode 5*b*. As a result, even in the case where a semiconductor element containing a brittle low-permittivity insulating film such as a low-k film or an ultra low-k film as an interlayer insulating film is flip-chip mounted on a circuit board, high connection reliability can be obtained.

Figure 4:
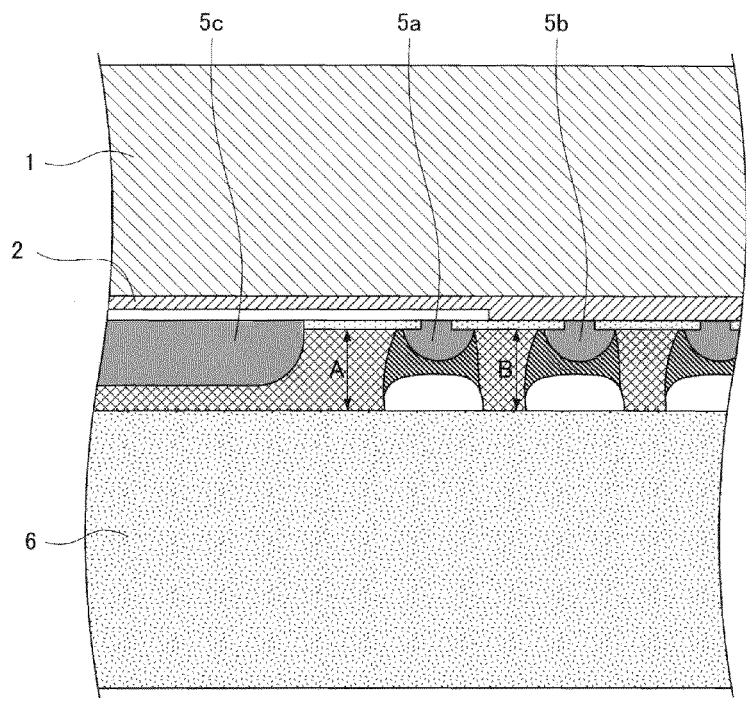
FIG. 4 is a conceptual diagram illustrating the electronic-component mounted body according to the first embodiment of the present invention.
Figure 4:
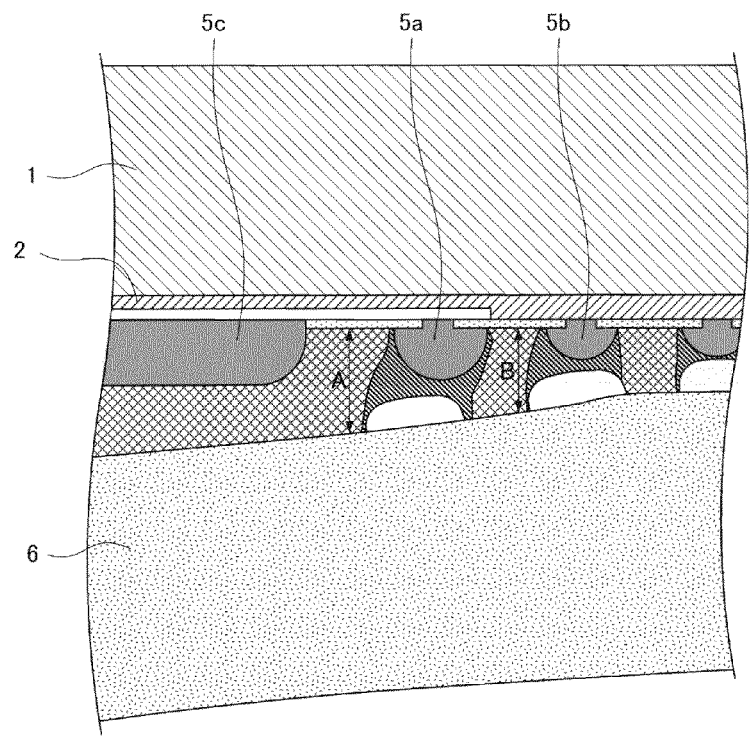

Specifically, in the process of cooling after solder is molten in the step of mounting the semiconductor element 1 on the circuit board 6, the circuit board is likely to be warped in the vicinity of the corner portion of the semiconductor element 1 due to differences in modulus of elasticity and linear expansivity between the semiconductor element 1 and the circuit board 6. As a result, the bond portion is extended the most in the vicinity of the corner portion of the semiconductor element 1 in a vertical direction (tensile direction). Thus, in the case where the bond gaps are uniform between the semiconductor element 1 and the circuit board 6 as in the related art, specifically, as shown in FIG. 4(a), in the case where the first protruded electrode 5a in the vicinity of the corner portion of the semiconductor element 1 is equal in height to the second protruded electrode 5b in the different position from the vicinity of the corner portion of the semiconductor element 1 and the bond gap A at the bond portion containing the first protruded electrode 5a is equal to the bond gap B at the bond portion containing the second protruded electrode 5b, a stress received by the bond portion in the vicinity of the corner portion of the semiconductor element 1 is represented as E×I/B where the modulus of elasticity of the bond portion is approximately set as E and the amount of extension of the bond portion in the vicinity of the corner portion of the semiconductor element 1 in the cooling process is set as I. This stress is transmitted to the brittle low-permittivity insulating film 2 directly on the component-side electrode terminal 3a. The stress exceeds the fracture stress of the low-permittivity insulating film 2. Thus, the low-permittivity insulating film 2 peels off or cracks on the interface of the low-permittivity insulating film 2.

Meanwhile, in the first embodiment, as shown in FIG. 4(b), the first protruded electrode 5a in the vicinity of the corner portion of the semiconductor element 1 is higher than the second protruded electrode 5b in the different position from the vicinity of the corner portion of the semiconductor element 1, so that the relationship between the bond gap A at the bond portion containing the first protruded electrode 5a and the bond gap B at the bond portion containing the second protruded electrode 5b is represented as A>B. Thus, a stress received by the bond portion in the vicinity of the corner portion of the semiconductor element 1 is represented as E×I/A, smaller than in the related art. As a result, since the stress received by the bond portion in the vicinity of the corner portion of the semiconductor element 1 falls below the fracture stress of the brittle low-permittivity insulating film 2, the low-permittivity insulating film 2 can be prevented from peeling off or cracking on the interface of the low-permittivity insulating film 2.

As described above, the protruded electrode forming the bond portion in the position with the largest gap between the semiconductor element and the circuit board in the step of mounting the semiconductor element on the circuit board is set higher than the protruded electrode forming the bond portion in the other position. Thus, the stress received by the brittle low-permittivity insulating film can be reduced, thereby obtaining high connection reliability.

Second Embodiment

Figure 5A:
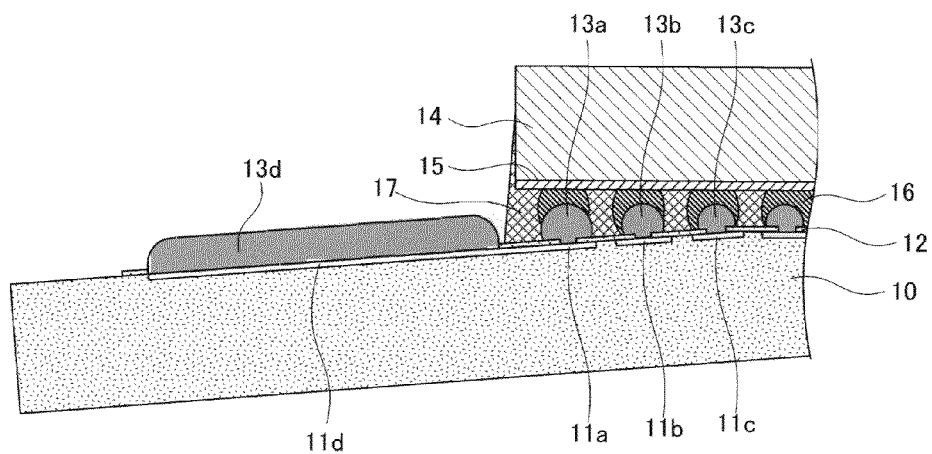
FIG. 5A is a cross-sectional view schematically illustrating the principal part of an electronic-component mounted body according to a second embodiment of the present invention.
Figure 5B:
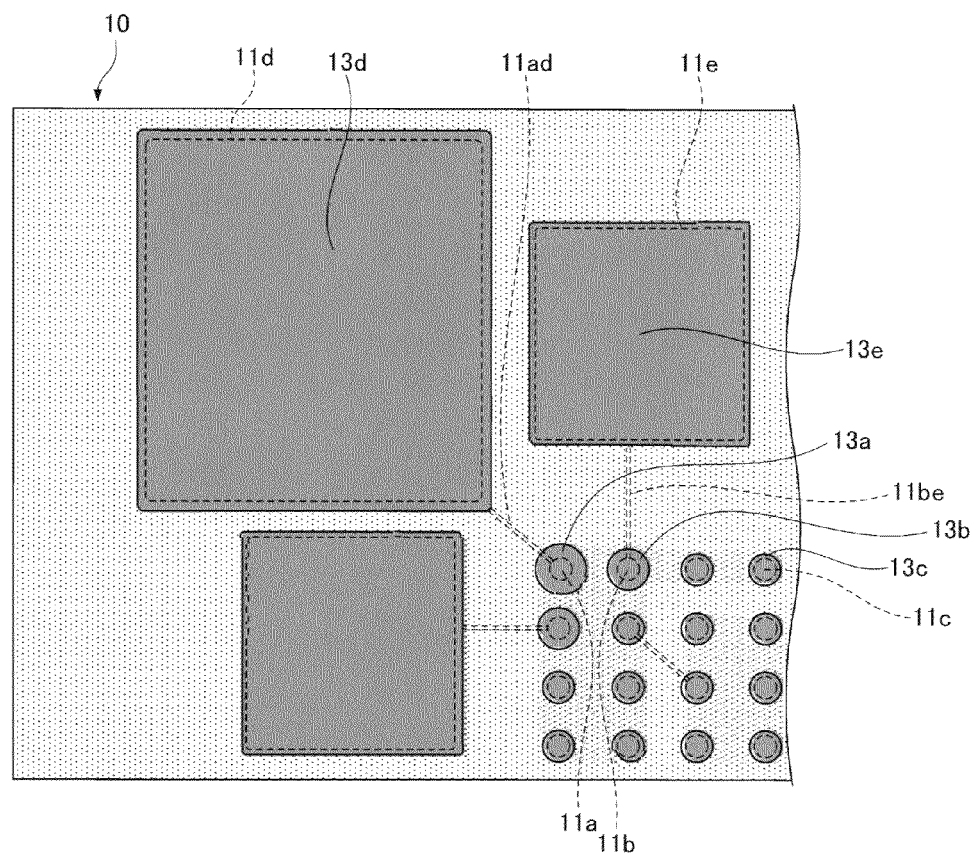
FIG. 5B is a plan view schematically illustrating the principal part of the electronic-component mounted body according to the second embodiment of the present invention.

FIG. 5A is a cross-sectional view schematically illustrating the principal part of a semiconductor device according to a second embodiment of the present invention. FIG. 5B is a plan view schematically illustrating the principal part of a circuit board according to the second embodiment of the present invention, the circuit board being viewed from the major surface on which circuit-board side electrode terminals are formed.

A circuit board 10 may be, for example, a glass epoxy multilayer board, aramid multilayer board, or silicon board. On the circuit board 10, circuit-board side electrode terminals 11 made of, for example, Al—Si—Cu are provided at regular intervals in a matrix pattern.

The multiple circuit-board side electrode terminals 11 include a first circuit-board side electrode terminal 11a, a second circuit-board side electrode terminal 11b, and a third circuit-board side electrode terminal 11c disposed in a different position from the first and second circuit-board side electrode terminals 11a and 11b. The first circuit-board side electrode terminal 11a is disposed in a position corresponding to the corner portion of a semiconductor element mounted on the circuit board 10. The second circuit-board side electrode terminal 11b is disposed next to the first circuit-board side electrode terminal 11a along the circumferential direction of an area where the multiple circuit-board side electrode terminals 11 are disposed. Further, a first dummy electrode 11d and a second dummy electrode 11e are provided outside the area where the multiple circuit-board side electrode terminals 11 are disposed. The first dummy electrode 11d and the second dummy electrode 11e have a larger area than the circuit-board side electrode terminals 11. The first dummy electrode 11d is larger in area than the second dummy electrode 11e and is electrically connected to the first circuit-board side electrode terminal 11a via a wire 11ad. Moreover, the second dummy electrode 11e is electrically connected to the second circuit-board side electrode terminal 11b via a wire 11be. For example, the first circuit-board side electrode terminal 11a, the second circuit-board side electrode terminal 11b, the third circuit-board side electrode terminal 11c, the first dummy electrode 11d, the second dummy electrode 11e, the wire 11ad, and the wire 11be may lie in the same plane. All of the first circuit-board side electrode terminal 11a, the second circuit-board side electrode terminal 11b, the third circuit-board side electrode terminal 11c, the first dummy electrode 11d, the second dummy electrode 11e, the wire 11ad, and the wire 11be are made of, for example, Al—Cu or Al—Si—Cu.

Further, an insulating film 12 is provided over the major surface of the circuit board 10. The insulating film 12 has a plurality of openings which expose at least a part of each of the first circuit-board side electrode terminal 11a, the second circuit-board side electrode terminal 11b, the third circuit-board side electrode terminal 11c, the first dummy electrode 11d, and the second dummy electrode 11e, and covers wires on the major surface of the circuit board 10. The insulating film 12 is made of, for example, $Si_3N_4$.

Moreover, on the first circuit-board side electrode terminal 11a, the second circuit-board side electrode terminal 11b, the third circuit-board side electrode terminal 11c, the first dummy electrode 11d, and the second dummy electrode 11e, a first protruded electrode 13a, a second protruded electrode 13b, a third protruded electrode 13c, a first dummy protruded electrode 13d, and a second dummy protruded electrode 13e are provided, respectively. The first protruded electrode 13a, the second protruded electrode 13b, the third protruded electrode 13c, the first dummy protruded electrode 13d, and the second dummy protruded electrode 13e are made of a metal such as Ni—P/Au or Ni—Au having solder wettability.

Meanwhile, on the inner layer of the electrode surface (major surface) of a semiconductor element 14, provided is a multilayered wiring layer containing a micro wiring layer made of, for example, copper or aluminum and a low-permittivity insulating film 15 such as an extremely low-k film which is brittler than an ultra low-k film. On the outermost surface of the multilayered wiring layer, solder bumps 16 serving as component-side electrode terminals are area-arrayed so as to be opposed to the circuit-board side electrode terminals 11 on the circuit board 10. The solder bumps 16 are made of, for example, Sn—Ag, Sn—Ag—Cu, or Sn—Bi.

The semiconductor element 14 is mounted on the circuit board 10, and the solder bumps 16 on the semiconductor element 14 are joined by solder and connected electrically and mechanically to the first protruded electrode 11a, the second protruded electrode 11b, and the third protruded electrode 11c or the circuit board 10. Further, sealing resin 17 is injected into a gap between the semiconductor element 14 and the circuit board 10.

In the second embodiment, the solder bumps 16 on the semiconductor element 14 are arranged with a pitch of 40 μm. Further, the openings of the insulating film 12 for the circuit-board side electrode terminals 11 on the circuit board 10 are circle-shaped with a diameter of 12 μm. Moreover, the opening of the insulating film 12 for the first dummy electrode 11d on the circuit board 10 is square-shaped with dimensions of 800 μm×800 μm. The opening of the insulating film 12 for the second dummy electrode 11e on the circuit board 10 is square-shaped with dimensions of 400 μm×400 μm.

Figure 6:
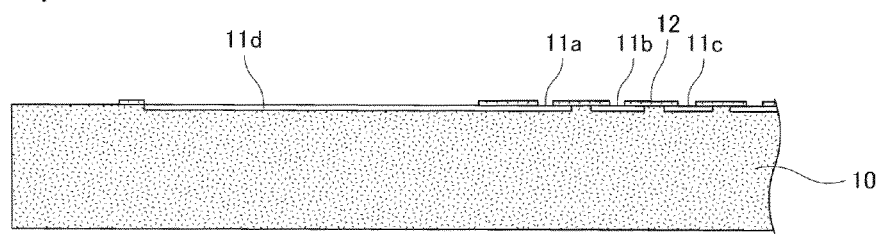
FIG. 6 is a conceptual diagram illustrating a method for manufacturing the electronic-component mounted body according to the second embodiment of the present invention from one step to another.
Figure 6:
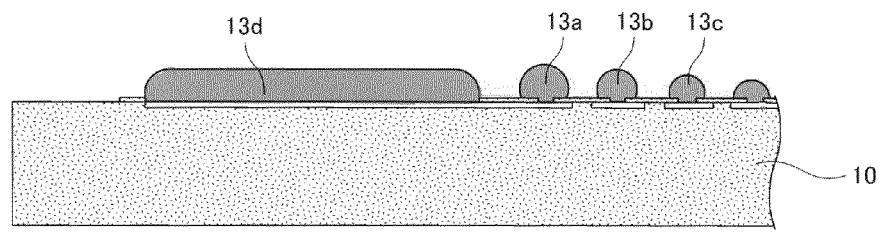
Figure 6:
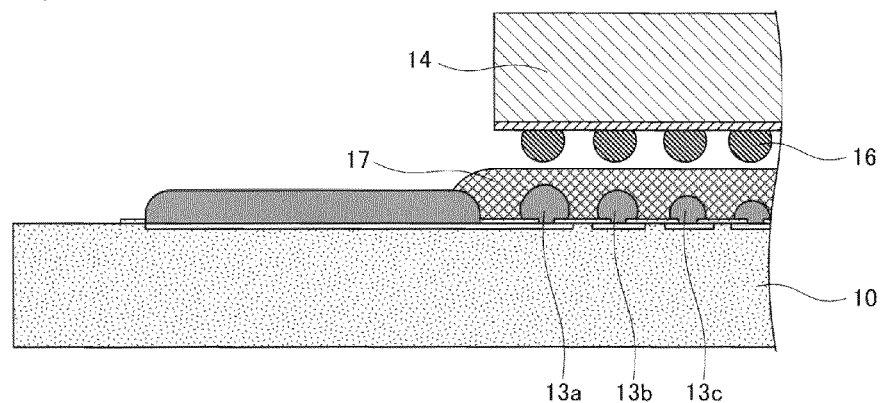
Figure 6:
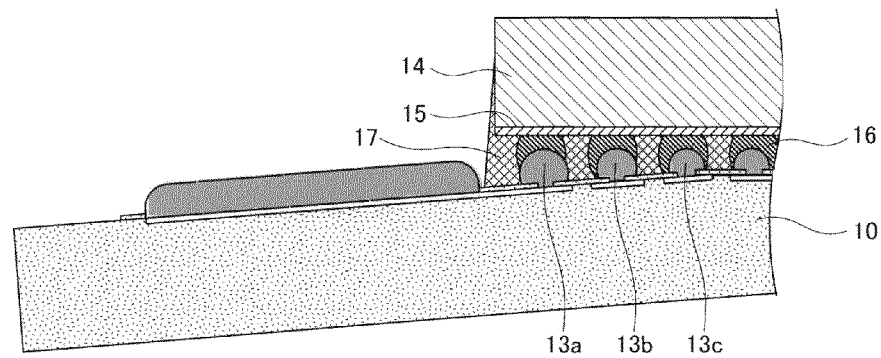

Next, an example of a method for manufacturing the semiconductor device will be described with reference to FIG. 6. FIG. 6 is a conceptual diagram illustrating the method for manufacturing the semiconductor device according to the second embodiment of the present invention from one step to another.

First, as shown in FIGS. 6(a) and 6(b), the first protruded electrode 13a, the second protruded electrode 13b, the third protruded electrode 13c, the first dummy protruded electrode 13d, and the second dummy protruded electrode 13e are formed on the first circuit-board side electrode terminal 11a, the second circuit-board side electrode terminal 11b, the third circuit-board side electrode terminal 11c, the dummy electrode 11d, and the dummy electrode 11e on the circuit board 10 by an electroless plating process. Specifically, after impurities are removed from the surfaces of the electrodes, the circuit board 10 is immersed in a zinc plating solution, and thus aluminum as the material of the electrode is replaced by zinc. Next, after zinc nuclei are removed, the circuit board 10 is immersed in the zinc plating solution again, so that smaller zinc nuclei are deposited on aluminum as the electrode material. Subsequently, the circuit board 10 is immersed in a Ni—P plating solution to dissolve zinc, thereby depositing a Ni—P film on aluminum as the electrode material. Thereafter, the circuit board 10 is immersed in an electroless gold plating solution to deposit a Au film on the Ni—P film. Thus, the protruded electrodes are formed of an electroless plating metal.

In this step, as shown in FIG. 5(b), since the first dummy electrode 11d has a larger area than the second dummy electrode 11e, plating is deposited on the first circuit-board side electrode terminal 11a electrically connected to the first dummy electrode 11d at a higher rate than on the second circuit-board side electrode terminal 11b electrically connected to the second dummy electrode 11e. Further, since the second dummy electrode 11e has a larger area than the circuit-board side electrode terminals 11, plating is deposited on the second circuit-board side electrode terminal 11b at a higher rate than on the third circuit-board side electrode terminal 11c not electrically connected to the first and second dummy electrodes 11d and 11e. As a result, as shown in FIG. 6(b), the protruded electrodes are ranked in ascending order of height as follows: the third protruded electrode 13c; the second protruded electrode 13b; and the first protruded electrode 13a.

As described above, in the method for manufacturing the semiconductor device according to the second embodiment, as in the first embodiment, an electroless plating process is used to control electron exchange in accordance with the area of the dummy electrode. In the second embodiment, the first protruded electrode 13a, the second protruded electrode 13b, and the third protruded electrode 13c are 10 μm, 9 μm, and 8 μm, respectively, in height. Thus, in the second embodiment, the first protruded electrode 13a disposed in a position corresponding to the corner portion of the semiconductor element 14 and the second protruded electrode 13b next to the first protruded electrode 13a are set higher than the third protruded electrode 13d disposed in a different position from the first protruded electrode 13a and the second protruded electrode 13b. Further, the area of the first dummy protruded electrode 13d is at least 10000 times as large as that of the first protruded electrode 13a (projected area when the first protruded electrode 13a is viewed in a height direction). The area of the second dummy protruded electrode 13e is at least 100 times as large as that of the second protruded electrode 13b (projected area when the second protruded electrode 13b is viewed in the height direction).

Next, as shown in FIG. 6(c), the sealing resin 17 is supplied over the first protruded electrode 13a, the second protruded electrode 13b, and the third protruded electrode 13c on the circuit board 10. For example, a non-conductive film (NCF) may be attached onto the circuit board 10 or a non-conductive paste (NCP) may be supplied onto the circuit board 10 by a dispenser.

Subsequently, as shown in FIG. 6(d), the semiconductor element 14 is aligned with the circuit board 10 such that the first protruded electrode 13a, the second protruded electrode 13b, and the third protruded electrode 13c on the circuit board 10 are opposed to the solder bumps 16 on the semiconductor element 14. Thereafter, the semiconductor element 14 is pressed to the circuit board 10 while being heated, so that the semiconductor element 14 is mounted on the circuit board 10. At this point, the solder bumps 16 are heated at a temperature not lower than the melting point of solder. Thus, the solder bumps 16 are molten to bond the first protruded electrode 13a, the second protruded electrode 13b, and the third protruded electrode 13c to the solder bumps 16. After that, the sealing resin 17 starts being cured. The sealing resin 17 may be further heated in a batch furnace to surely complete the curing reaction of the sealing resin 17.

In the second embodiment, the low-permittivity insulating film is brittler and the component-side electrode terminals (solder bumps 16) are arranged with narrower pitch than in the first embodiment. Thus, if the protruded electrodes are uniform in height, not only a stress received by a bond portion in the corner portion of the semiconductor element 14 but also a stress received by a bond portion next to the bond portion in the corner portion exceeds the fracture strength of the brittle low-permittivity insulating film 15 due to differences in modulus of elasticity and linear expansivity between the semiconductor element 14 and the circuit board 10 in the process of cooling in the step of mounting the semiconductor element 14 on the circuit board 10. The low-permittivity insulating film 15 peels off or cracks on the interface of the low-permittivity insulating film 15.

In contrast, in the second embodiment, the protruded electrodes are ranked in ascending order of height as follows: the third protruded electrode 13c; the second protruded electrode 13b adjacent to the corner portion of the semiconductor element 1; and the first protruded electrode 13a positioned in the corner portion of the semiconductor element 1. Thus, a stress received in the cooling process is reduced not only in the bond portion in the corner portion of the semiconductor element 1 but also in the bond portion next to the bond portion in the corner portion. Hence, even in the case where a semiconductor element having a brittle low-permittivity insulating film and electrode terminals arranged with narrow pitch is flip-chip mounted, the low-permittivity insulating film can be prevented from being peeled off or cracked.

After cutting the above-described semiconductor device, polishing the cross-section of the semiconductor device, and observing the polished cross-section, it was confirmed that the gap between the semiconductor element and the circuit board was the largest in the corner portion of the semiconductor element, and the brittle low-permittivity insulating film was not peeled off or cracked. Further, as a result of conducting a temperature cycling test (one cycle: −45° C., 85° C., 30 minutes each) on the semiconductor device, stable connection resistance could be obtained even after 1000 cycles.

As described above, even in the case where the semiconductor element having electrode terminals arranged with narrower pitch and a brittler low-permittivity insulating film than in the first embodiment is flip-chip mounted, the heights of the protruded electrodes are changed stepwise to reduce a stress received by the low-permittivity insulating film, thereby obtaining high connection reliability.

In the present embodiment, the heights of the protruded electrodes are set at three levels. However, the heights may be set at not fewer than three levels. The heights of the protruded electrodes are set at not fewer than three levels, so that the protruded electrodes can be applied to a brittler element and a largely warped circuit board.

Moreover, in the present embodiment, the heights of the protruded electrodes are set at three levels. As in the first embodiment, however, only the protruded electrode for the corner portion of the semiconductor element, out of the protruded electrodes provided on the circuit board, may be set higher than the other protruded electrodes. Conversely, in the first embodiment, as in the second embodiment, the heights of the protruded electrodes provided on the semiconductor element may be set at not fewer than three levels.

Third Embodiment

Figure 7A:
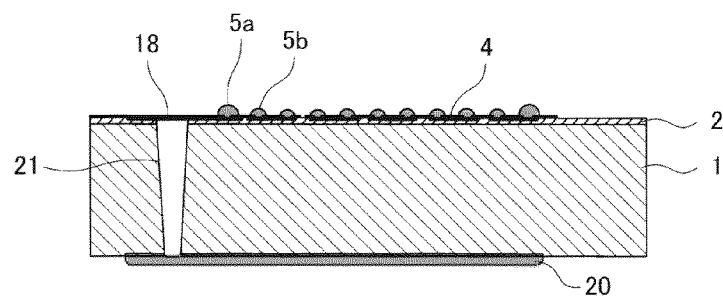
FIG. 7A is a cross-sectional view schematically illustrating the principal part of an electronic component according to a third embodiment of the present invention.
Figure 7B:
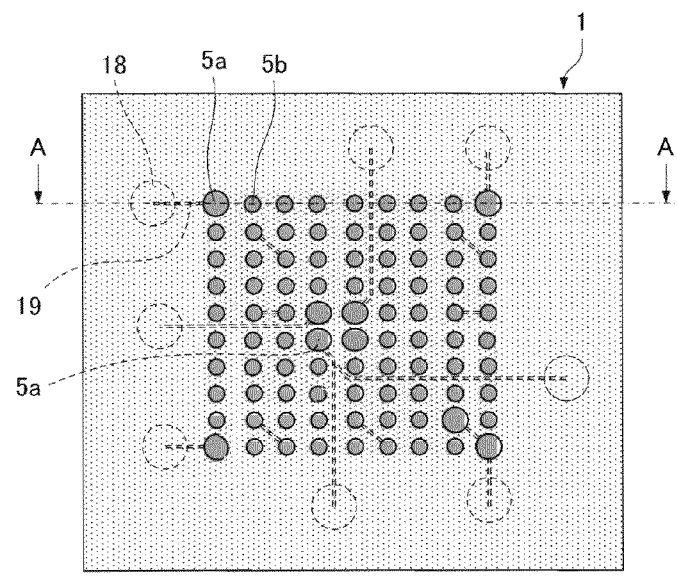
FIG. 7B is a plan view schematically illustrating the principal part of the electronic component according to the third embodiment of the present invention.
Figure 7C:
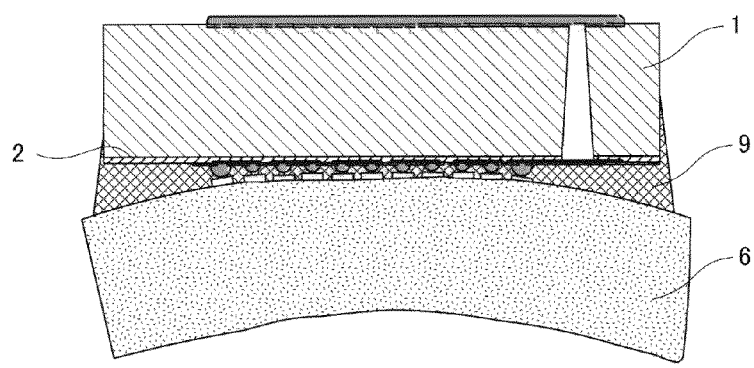
FIG. 7C is a cross-sectional view schematically illustrating the principal part of an electronic-component mounted body according to the third embodiment of the present invention.
Figure 8:
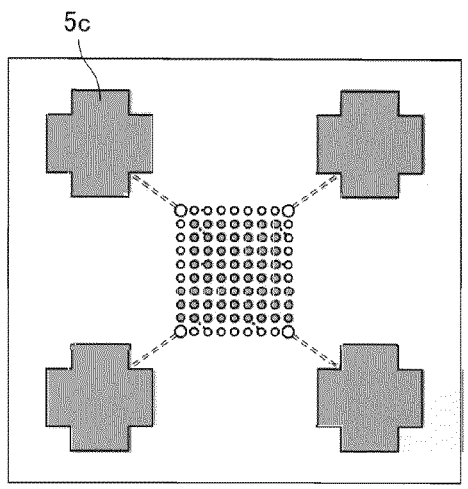
FIG. 8 is a plan view schematically illustrating the principal part of an electronic component according to a fourth embodiment of the present invention.
Figure 8:
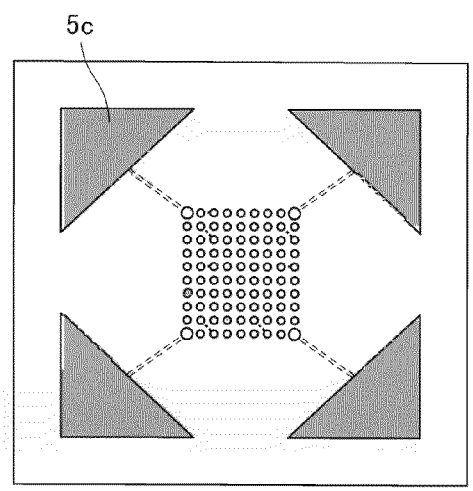
Figure 8:
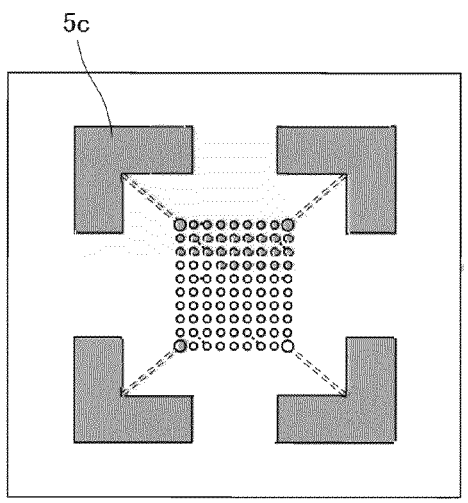
Figure 8:
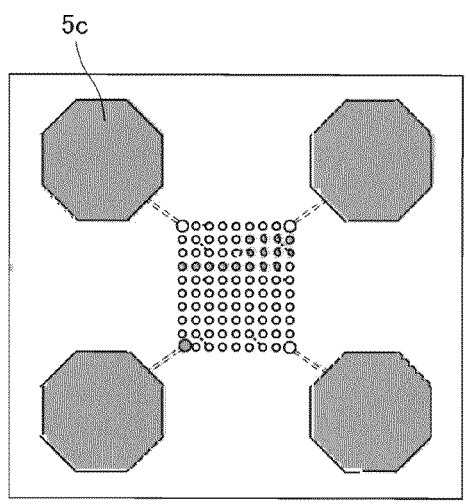
Figure 9:
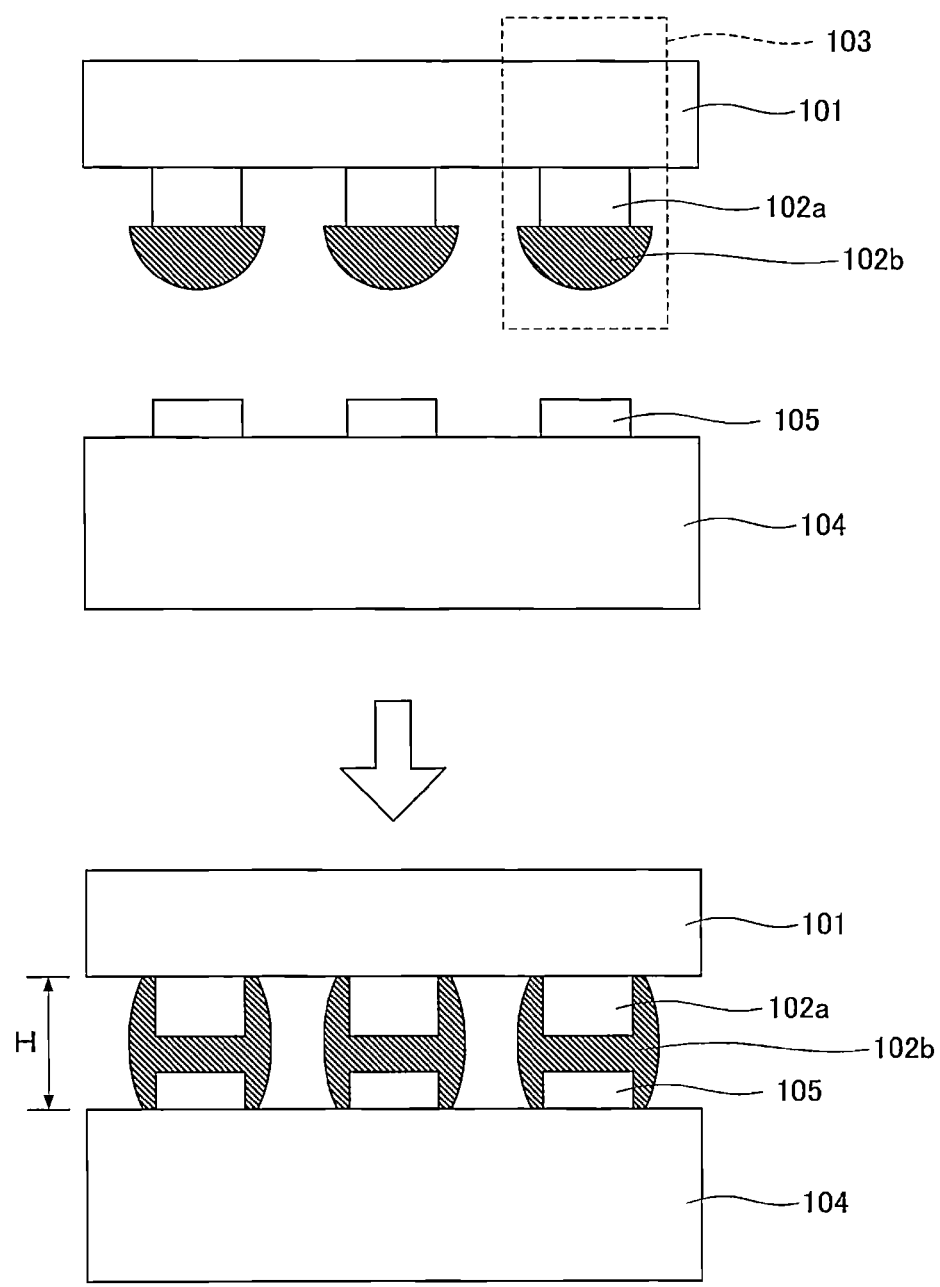
FIG. 9 is a schematic diagram illustrating the principal part of a semiconductor device according to the related art.

FIG. 7A is a cross-sectional view schematically illustrating the principal part of a semiconductor element according to a third embodiment of the present invention. FIG. 7B is a plan view schematically illustrating the principal part of the semiconductor element according to the third embodiment of the present invention, the semiconductor element being viewed from the major surface (electrode surface) on which component-side electrode terminals are formed. FIG. 7C is a cross-sectional view schematically illustrating the principal part of a semiconductor device according to the third embodiment of the present invention. Members corresponding to the members described in the first embodiment are indicated by the same reference numerals, and the explanation thereof is omitted as appropriate.

As shown in FIGS. 7A and 7B, on the inner layer of the electrode surface of a semiconductor element 1, a multilayered wiring layer is provided which includes a micro wiring layer made of, for example, copper or aluminum and a brittle low-permittivity insulating film 2 such as an ultra low-k film. A plurality of component-side electrode terminals 3 are arranged with a pitch of 40 μm in a matrix pattern on the outermost surface of the multilayered wiring layer.

The multiple component-side electrode terminals 3 include first component-side electrode terminals 3a and second component-side electrode terminals 3b disposed in different positions from the first component-side electrode terminals 3a. In the third embodiment, the first component-side electrode terminals 3a are disposed not only in positions corresponding to the corner portions of the semiconductor element but also in the center of an area where the component-side electrode terminals 3 are disposed. Further, lands 18 are disposed outside the area where the component-side electrode terminals 3 are disposed, and the first component-side electrode terminals 3a are electrically connected to the lands 18 by wires 19.

Moreover, an insulating film 4 is provided over the electrode surface of the semiconductor element 1. The insulating film 4 covers the wires and the lands 18 in the same plane as the component-side electrode terminals 3 and has a plurality of openings which expose the respective center portions of the component-side electrode terminals 3. The insulating film 4 is made of, for example, $Si_3N_4$. On a region of the component-side electrode terminals 3 not covered by the insulating film 4, protruded electrodes 5 called under bump metals (UBMs) are provided. The protruded electrodes 5 include first protruded electrodes 5a formed on the first component-side electrode terminals 3a and second protruded electrodes 5b formed on the second component-side electrode terminals 3b. The first protruded electrodes 5a and the second protruded electrodes 5b are formed by an electroless plating process, and the height of the first protruded electrode 5a from the electrode surface is larger than that of the second protruded electrode 5b from the electrode surface.

Meanwhile, on a surface opposite to the electrode surface of the semiconductor element 1, a dummy electrode 20 is provided. In the third embodiment, the dummy electrode 20 is square-shaped with dimensions of 3 mm×3 mm. The dummy electrode 20 is electrically connected to the land 18 via a through hole 21. The through hole 21 is filled with a plated metal. The land 18 and the dummy electrode 20 are each made of, for example, a Nd—P/Au film. The Ni—P/Au film is formed by, for example, an electroless plating process. The plated metal filling the through hole 21 is made of, for example, copper. On the interfaces of the land 18, dummy electrode 20 and through hole 21, a seed layer made of, for example, titanium or tungsten may be provided.

As shown in FIG. 7C, a circuit board 6 with the semiconductor element 1 mounted thereon has circuit-board side electrode terminals on the major surface, the circuit-board side electrode terminals being opposed to the protruded electrodes on the semiconductor element 1, respectively. The circuit board 6 may be, for example, a glass epoxy multilayer board, aramid multilayer board, or silicon board. The protruded electrodes on the semiconductor element 1 are joined by solder and electrically connected to the circuit-board side electrode terminals on the circuit board 6, and sealing resin 9 is injected into a gap between the semiconductor element 1 and the circuit board 6.

In the third embodiment, since the dummy electrode does not lie in the same plane as the component-side electrode terminals, the area of the semiconductor element 1 can be reduced as compared to the first embodiment. Further, since the protruded electrode 5a positioned in the corner portion of the semiconductor element 1 is higher than the protruded electrode 5b not electrically connected to the dummy electrode 20, as in the first embodiment, the brittle low-permittivity insulating film can be prevented from being peeled off or cracked.

Moreover, since the dummy electrode 20 is provided on the surface opposite to the electrode surface of the semiconductor element 1, the dummy electrode 20 may be connected to a heat sink such as a radiator plate or a radiator fin. In the case where the electrode terminals on the semiconductor element are disposed with narrow pitch, the cross-sectional area of the bond portion is extremely small, thereby increasing the amount of heat generated from the bond portion. In addition, the electrode terminals disposed with narrow pitch on the semiconductor element reduce heat dissipation from the bond portion. Particularly, heat dissipation from the bond portion in the center of the area where the component-side electrode terminals are disposed is reduced. In contrast, in the third embodiment, the component-side electrode terminals 3a electrically connected to the dummy electrode 20 are also provided in the center of the area where the component-side electrode terminals are disposed and thus, if the dummy electrode 20 is connected to a heat sink, heat which is hardly dissipated in the center can be released. Hence, even in the case where a large amount of current is applied to the bond portion with an extremely small cross section, heat can be dissipated. For this reason, the semiconductor element according to the third embodiment is useful for a semiconductor element having electrode terminals disposed with narrow pitch.

Since the protruded electrodes are formed by an electroless plating process, the protruded electrodes 5a electrically connected to the dummy electrode 20 are larger, not only in height but also in diameter, than the protruded electrodes 5b not electrically connected to the dummy electrode 20. In the third embodiment, the first protruded electrodes 5a are 12 µm in height and 29 µm in mean diameter, while the second protruded electrodes 5b are 10 µm in height and 25 µm in mean diameter. The first protruded electrodes 5a are 2 µm larger in height and 4 µm larger in mean diameter than the second protruded electrodes 5b. Thus, if the dummy electrode 20 is connected to the source of electricity, the power supply terminal allowing the passage of a large amount of current can be set larger in diameter than the other protruded electrodes which are not power supply terminals. Hence, problems such as electromigration can be prevented.

As described above, according to the third embodiment, a stress received by the brittle low-permittivity insulating film can be reduced without increasing the area of the semiconductor element and the size of the semiconductor package, thereby obtaining high connection reliability.

Fourth Embodiment

FIGS. 8(a) to 8(d) are plan views schematically illustrating the principal part of a semiconductor element according to a fourth embodiment of the present invention, the semiconductor element being viewed from the major surface (electrode surface) on which component-side electrode terminals are formed. Members corresponding to the members described in the first embodiment are indicated by the same reference numerals, and the explanation thereof is omitted as appropriate.

As shown in FIGS. 8(a) to 8(d), dummy protruded electrodes 5c electrically connected to first protruded electrodes 5a may be shaped so as to function as recognition marks for position adjustment which are imaged by an image recognition camera during flip-chip mounting.

In the fourth embodiment, as in the first embodiment, outside the area where the component-side electrode terminals 3 are disposed, the single type of dummy protruded electrodes 5c having the same area is provided. As described in the second embodiment, however, in the case where different types of dummy protruded electrodes having different areas are provided, at least some of the dummy protruded electrodes may function as recognition marks.

In the above-described embodiments, examples of an electronic component include, but not limited to, a semiconductor element. The above-described embodiments can be achieved also in the case of mounting, on a circuit board, an electronic component having electrode terminals disposed with narrow pitch such as a capacitor, coil, or resistor.

INDUSTRIAL APPLICABILITY

The electronic-component mounted body, electronic component, and circuit board according to the present invention having increased connection reliability between the electronic component and the circuit board are useful particularly in the field of mounting, on a circuit board, a semiconductor element having electrode terminals disposed with narrow pitch or a semiconductor element having an interlayer insulating film made of a low-permittivity material.

The invention claimed is:

1. An electronic-component mounted body comprising:
   an electronic component having a plurality of component-side electrode terminals;
   a circuit board having a plurality of circuit-board side electrode terminals for the component-side electrode terminals, the electronic component being mounted on the circuit board;
   a plurality of protruded electrodes formed respectively on the component-side electrode terminals on the electronic component to electrically connect the electronic component and the circuit board; and
   at least one dummy electrode formed on the electronic component and electrically connected to the component-side electrode terminal in a predetermined position out of the component-side electrode terminals, wherein
   the protruded electrode on the component-side electrode terminal in the predetermined position electrically connected to the at least one dummy electrode is higher than the protruded electrodes on the component-side electrode terminals in different positions from the predetermined position.

2. The electronic-component mounted body according to claim 1, wherein the at least one dummy electrode is electrically connected to the component-side electrode terminal disposed in a position corresponding to a corner portion of the electronic component, out of the component-side electrode terminals.

3. The electronic-component mounted body according to claim 1, wherein
   the at least one dummy electrode comprises a plurality of different types of dummy electrodes having different areas, and
   the protruded electrode on the component-side electrode terminal electrically connected to the dummy electrode having a larger area than the other dummy electrodes is higher than the other protruded electrodes.

4. The electronic-component mounted body according to claim 3, wherein
   the dummy electrodes include: the first dummy electrode electrically connected to the first component-side electrode terminal disposed in a position corresponding to a corner portion of the electronic component; and the second dummy electrode electrically connected to the second component-side electrode terminal adjacent to the first component-side electrode terminal, the second dummy electrode having a smaller area than the first dummy electrode, and
   the protruded electrode on the first component-side electrode terminal is higher than the protruded electrode on the second component-side electrode terminal.

5. The electronic-component mounted body according to claim 1, wherein the at least one dummy electrode is formed on a surface different from a surface of the electronic component on which the component-side electrode terminals are disposed.

6. The electronic-component mounted body according to claim 5, wherein the at least one dummy electrode is electrically connected to the component-side electrode terminal disposed in a position corresponding to a corner portion of the electronic component, out of the component-side electrode terminals.

7. The electronic-component mounted body according to claim 6, wherein the component-side electrode terminals are arranged in a matrix pattern, and the at least one dummy electrode is electrically connected to the component-side electrode terminal in a center of an area where the component-side electrode terminals are disposed.

8. The electronic-component mounted body according to claim 5, wherein the at least one dummy electrode is connected to a power supply terminal.

9. The electronic-component mounted body according to claim 5, wherein the at least one dummy electrode is connected to a heat sink.

10. The electronic-component mounted body according to claim 1, wherein the at least one dummy electrode is formed on a surface on which the component-side electrode terminals are disposed and is shaped so as to function as a recognition mark for position adjustment.

11. An electronic-component mounted body comprising:
an electronic component having a plurality of component-side electrode terminals;
a circuit board having a plurality of circuit-board side electrode terminals for the component-side electrode terminals, the electronic component being mounted on the circuit board;
a plurality of protruded electrodes formed respectively on the circuit-board side electrode terminals on the circuit board to electrically connect the electronic component and the circuit board;
at least one dummy electrode formed on the circuit board and electrically connected to the circuit-board side electrode terminal in a predetermined position out of the circuit-board side electrode terminals, wherein
the protruded electrode on the circuit-board side electrode terminal in the predetermined position electrically connected to the at least one dummy electrode is higher than the protruded electrodes on the circuit-board side electrode terminals in different positions from the predetermined position.

12. The electronic-component mounted body according to claim 11, wherein the at least one dummy electrode is electrically connected to the circuit-board side electrode terminal disposed in a position corresponding to a corner portion of the electronic component, out of the circuit-board side electrode terminals.

13. The electronic-component mounted body according to claim 11, wherein
the at least one dummy electrode comprises a plurality of different types of dummy electrodes having different areas, and
the protruded electrode on the circuit-board side electrode terminal electrically connected to the dummy electrode having a larger area than the other dummy electrodes is higher than the other protruded electrodes.

14. The electrode-component mounted body according to claim 13, wherein the dummy electrodes include: the first dummy electrode electrically connected to the first circuit-board side electrode terminal disposed in a position corresponding to a corner portion of the electronic component; and the second dummy electrode electrically connected to the second circuit-board side electrode terminal adjacent to the first circuit-board side electrode terminal, the second dummy electrode having a smaller area than the first dummy electrode, and
the protruded electrode on the first circuit-board side electrode terminal is higher than the protruded electrode on the second circuit-board side electrode terminal.

15. An electronic component comprising:
a plurality of component-side electrode terminals;
at least one dummy electrode electrically connected to the component-side electrode terminal in a predetermined position out of the component-side electrode terminals; and
a plurality of protruded electrodes formed respectively on the component-side electrode terminals, wherein
the protruded electrode on the component-side electrode terminal in the predetermined position electrically connected to the at least one dummy electrode is higher than the protruded electrodes on the component-side electrode terminals in different positions from the predetermined position.

16. The electronic component according to claim 15, wherein the at least one dummy electrode is electrically connected to the component-side electrode terminal disposed in a position corresponding to a corner portion of the electronic component, out of the component-side electrode terminals.

17. The electronic component according to claim 15, wherein
the at least one dummy electrode comprises a plurality of different types of dummy electrodes having different areas, and
the protruded electrode on the component-side electrode terminal electrically connected to the dummy electrode having a larger area than the other dummy electrodes is higher than the other protruded electrodes.

18. The electronic component according to claim 17, wherein
the dummy electrodes include: the first dummy electrode electrically connected to the first component-side electrode terminal disposed in a position corresponding to a corner portion of the electronic component; and the second dummy electrode electrically connected to the second component-side electrode terminal adjacent to the first component-side electrode terminal, the second dummy electrode having a smaller area than the first dummy electrode, and
the protruded electrode on the first component-side electrode terminal is higher than the protruded electrode on the second component-side electrode terminal.

19. The electronic component according to claim 15, wherein the at least one dummy electrode is formed on a surface different from a surface on which the component-side electrode terminals are disposed.

20. The electronic component according to claim 19, wherein the at least one dummy electrode is electrically connected to the component-side electrode terminal disposed in a position corresponding to a corner portion of the electronic component, out of the component-side electrode terminals.

21. The electronic component according to claim 20, wherein
the component-side electrode terminals are arranged in a matrix pattern, and
the at least one dummy electrode is electrically connected to the component-side electrode terminal in a center of an area where the component-side electrode terminals are disposed.

22. The electric component according to claim 15, wherein the at least one dummy electrode is formed on a surface on which the component-side electrode terminals are disposed and is shaped so as to function as a recognition mark for position adjustment.

23. A circuit board comprising:
a plurality of circuit-board side electrode terminals;
at least one dummy electrode electrically connected to the circuit-board side electrode terminal in a predetermined position out of the circuit-board side electrode terminals; and
a plurality of protruded electrodes formed respectively on the circuit-board side electrode terminals, wherein
the protruded electrode on the circuit-board side electrode terminal in the predetermined position electrically connected to the at least one dummy electrode is higher than the protruded electrodes on the circuit-board side electrode terminals in different positions from the predetermined position.

24. The circuit board according to claim 23, wherein the at least one dummy electrode is electrically connected to the circuit-board side electrode terminal disposed in a position corresponding to a corner portion of an electronic component mounted on the circuit board, out of the circuit-board side electrode terminals.

25. The circuit board according to claim 23, wherein
the at least one dummy electrode comprises a plurality of different types of dummy electrodes having different areas, and
the protruded electrode on the circuit-board side electrode terminal electrically connected to the dummy electrode having a larger area than the other dummy electrodes is higher than the other protruded electrodes.

26. The circuit board according to claim 25, wherein
the dummy electrodes include: the first dummy electrode electrically connected to the first circuit-board side electrode terminal disposed in a position corresponding to a corner portion of an electronic component mounted on the circuit board; and the second dummy electrode electrically connected to the second circuit-board side electrode terminal adjacent to the first circuit-board side electrode terminal, the second dummy electrode having a smaller area than the first dummy electrode, and
the protruded electrode on the first circuit-board side electrode terminal is higher than the protruded electrode on the second circuit-board side electrode terminal.

* * * * *

UNITED STATES PATENT AND TRADEMARK OFFICE
CERTIFICATE OF CORRECTION

| | |
|---|---|
| PATENT NO. | : 8,921,708 B2 |
| APPLICATION NO. | : 13/821521 |
| DATED | : December 30, 2014 |
| INVENTOR(S) | : Sakurai et al. |

It is certified that error appears in the above-identified patent and that said Letters Patent is hereby corrected as shown below:

Title page

Item "(87) PCT Pub No.: WO2012/073417
        PCT Pub. Date: Jul. 6, 2012"

should be item -- (87) PCT Pub No.: WO2012/073417
        PCT Pub. Date: June 7, 2012 --

Signed and Sealed this
Second Day of June, 2015

Michelle K. Lee
*Director of the United States Patent and Trademark Office*